United States Patent
Oppelt

(10) Patent No.: US 7,126,337 B2
(45) Date of Patent: Oct. 24, 2006

(54) RECEPTION UNIT FOR A MAGNETIC RESONANCE TOMOGRAPHY APPARATUS

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/200,815

(22) Filed: Aug. 10, 2005

(65) Prior Publication Data

US 2006/0038568 A1    Feb. 23, 2006

(30) Foreign Application Priority Data

Aug. 10, 2004    (DE) ............... 10 2004 038 849

(51) Int. Cl.
*G01V 3/00* (2006.01)
(52) U.S. Cl. .................. 324/322; 324/318
(58) Field of Classification Search ............. 324/322, 324/319, 318, 309, 307, 300; 600/410, 422
See application file for complete search history.

(56) References Cited

U.S. PATENT DOCUMENTS 5,828,216 A * 10/1998 Tschudin et al. ........... 324/322
6,573,720 B1 * 6/2003 Devasahayam et al. ..... 324/316
7,030,614 B1 * 4/2006 Matschl et al. ............. 324/318

OTHER PUBLICATIONS

Translation of Japanese Application 2001070277 A, published Mar. 21, 2001.

* cited by examiner

*Primary Examiner*—Brij B. Shrivastav
(74) *Attorney, Agent, or Firm*—Schiff Hardin LLP

(57) ABSTRACT

A reception unit for a magnetic resonance tomography apparatus has an RF preamplifier connected at its signal input to a local coil with a PIN diode connected in parallel with the signal input and a supply voltage connection of the RF preamplifier being connected to a direct voltage source. The reception unit has a supply node that is connected with the supply voltage connection, the PIN diode and a crossover switch for alternating connection of the supply node to the direct voltage source or a direct current source.

11 Claims, 4 Drawing Sheets

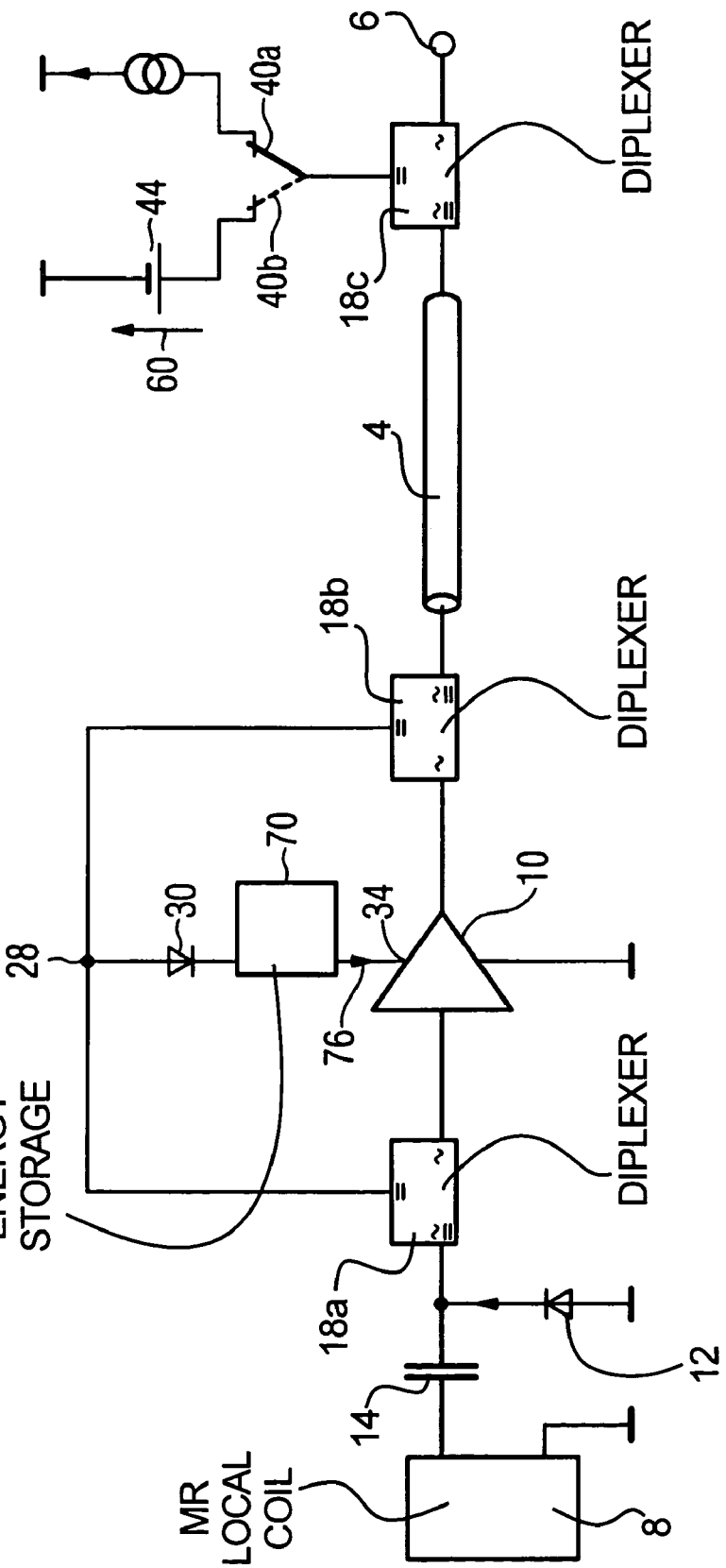

RECEPTION UNIT FOR A MAGNETIC RESONANCE TOMOGRAPHY APPARATUS

BACKGROUND OF THE INVENTION

1. Field of the Invention

The present invention concerns a reception unit for a magnetic resonance tomography apparatus.

2. Description of the Prior Art

In magnetic resonance tomography apparatus, subjects to be examined (for example body tissue of a patient) are excited to resonate on an atomic level by an excitation unit during a transmission phase. For this purpose, electromagnetic fields of extremely high field strengths are used. In a reception phase subsequent to the transmission phase, the excited regions of the subject to be examined radiate magnetic resonance signals that have field strengths smaller by many orders of magnitude than the excitation signals. The resonance signals are acquired by a reception unit of the magnetic resonance tomography apparatus and converted into image information.

Various local coils receive signals that are amplified by RF preamplifiers and conducted to an evaluation unit to acquire the extremely weak signals during the reception phase. The RF preamplifiers are designed for the extremely small voltages coming from the local coil.

During the transmission phase, instead of the resonance field a local coil is exposed to the electromagnetic excitation field (which as noted above is larger by many orders of magnitude thus the MR field), causing voltages that are higher by orders of magnitude occur at the local coil output. In order to protect the sensitive RF preamplifiers from these voltages, protective diodes (usually PIN diodes) are connected at the amplifier input. During the transmission phase, the PIN diode is fed with current and acts as a short circuit in terms of RF in order to protect the preamplifier from damage and simultaneously to prevent an impermissibly high resonance current from forming in the local coil. Such a resonance current could lead to severe burns to the patient or to unwanted resonance splitting in the magnetic resonance tomography apparatus, i.e. detuning of the individual resonances of the excitation and local coils.

During the reception phase, the PIN diode is supplied with a blocking voltage so that it is non-conductive for the RF signals to be acquired.

The diode current and the diode blocking voltage conventionally have been conducted via separate lines or separate coaxial cable from the external region (field-free region) into the inner region, thus from the site of the local coil or PIN diode into the strong field region of the magnetic resonance tomography apparatus. A problem is that dangerous sheath waves can propagate along all lines that lead from the inside of the magnetic resonance tomography apparatus to the outside. Sheath waves likewise endanger the patient due to skin burns or disrupt the functioning of the preamplifiers due to uncontrolled feedback though the local coil. Therefore, complex sheath wave barriers that prevent the propagation of sheath waves are arranged along all lines leading from the inside of the magnetic resonance tomography apparatus.

SUMMARY OF THE INVENTION

An object of the present invention is to improve a magnetic resonance tomography apparatus with regard to its RF circuitry by simplifying and lowering the cost of such RF circuitry.

This object is achieved by a reception unit for a magnetic resonance tomography apparatus having an RF preamplifier connected to a local coil at its signal input, with a PIN diode connected in parallel with the signal input, and wherein a supply voltage connection of the RF preamplifier is connectable to a direct voltage source. The reception unit contains a supply node that is connected with the supply voltage connection, the PIN diode and a cross-over switch for alternating connection of the supply node to the direct voltage source or a direct current source.

During the reception phase, the RF preamplifier must be supplied with direct voltage and, during this time, the PIN diode is to be charged with blocking voltage.

During the reception phase, the cross-over switch is therefore switched to a state wherein the voltage source is connected to the supply node and thus with the supply voltage connection so that the RF preamplifier operates. The signal input serves for acquisition of an electrical RF signal to be amplified and coming from a connection to the local coil. The local coil is then grounded at its other end. The PIN diode is then likewise grounded at one terminal and the other is connected with the signal-conducting connection of the local coil, and thus with the signal input of the RF preamplifier.

Since the PIN diode is likewise connected with the supply node, it is likewise supplied with direct voltage. The polarity of the PIN diode and the direct voltage are selected so that the direct voltage is present in the blocking direction at the PIN diode.

In the reception phase, the PIN diode thus also fulfills its purpose in a known manner, namely by being non-conductive due to being supplied with a blocking voltage, and influences the signal quality of the weak electrical signals acquired by the local coil as little as possible.

Adaptation of diode blocking voltage and operating voltage of the RF preamplifier can ensue, for example, by the selection of a suitable amplifier or a simple pre-resistor or a voltage regulator at the amplifier.

Since a corresponding path in the magnetic resonance tomography apparatus or the reception unit must already exist for supplying the RF preamplifier with direct voltage, this is now likewise used for supplying the PIN diode. The conventional separate feed line for supply of the PIN diode with direct voltage is omitted and thus the elaborate measures for suppression of sheath waves, etc. are not needed. The supply unit, and with it the entire magnetic resonance tomography apparatus, is simpler and more cost-effective, and the overall signal quality is improved by the absence of this supply line.

The invention furthermore is based on the recognition arises from the realization that the RF preamplifier is not needed during the transmission phase in which the PIN diode is to be fed with current. Therefore it does not have to be supplied with supply voltage, which is why the switching of the supply node from the voltage source to a current source ensues.

A direct current that feeds current to the PIN diode in the flow-through direction is thus fed at the supply node during the transmission phase.

The signal input of the RF preamplifier is protected and impermissibly high resonance currents in the local coil are prevented in a known manner by the PIN diode fed with current.

The feed line for the supply voltage, which is already present anyway and leads from the voltage source to the supply node, thus is also used in a time-multiplex manner for feeding the blocking voltage for the PIN diode. The PIN diode thus also requires no separate feed line in the transmission phase, which leads to the advantages cited above.

A negative potential is thus created at the supply voltage connection of the RF preamplifier for a conventional PIN diode that is fed with current in the flow-through direction. The amplifier thus does not operate. Either an amplifier can be selected that tolerates negative input voltages or, alternatively, a simple reverse polarity protection diode, for example, can be provided at its voltage supply connection.

A diplexer can be connected between the supply nodes, the signal input and the PIN diode and a direct current block can be connected between PIN diode and local coil.

The signal line leading from the local coil or the PIN diode to the signal input thus is divided and a diplexer is interconnected, with its radio-frequency connection connected with the signal input and its broadband connection leads to the PIN diode and the local coil. The low-frequency connection of the diplexer leading to the supply voltage connection of the preamplifier.

Forwarding from the supply node to the PIN diode of the identical quantities generated by voltage source or current source then ensues via the diplexer.

The direct current block between the PIN diode and the local coil prevents direct voltage or direct current from being forwarded to the local coil. The diplexer simultaneously protects the RF preamplifier from the identical magnitudes.

Via the diplexer and the direct current block, direct current or direct voltage is conducted from the supply nodes to the PIN diode without interfering with the intersecting RF signal path from the local coil to the signal input.

The supply voltage connection can be connected with the supply node via a protective diode. The protective diode ensures that, during reception, the diode conducts when direct voltage is present at the supply voltage connection and thus the RF preamplifier is supplied with direct voltage.

In the transmission mode, when direct current is thus conducted to the supply node via the cross-over switch, depending on the dimensioning of the entire circuit a voltage of opposite polarity to the supply voltage arises. This is isolated from the supply voltage connection of the RF amplifier by the protective diode in order to protect the RF amplifier from possible damage due to a reversal of polarity.

To transfer the reception signal (preamplified by the RF preamplifier) to the local coil during the reception phase, the signal output of the RF preamplifier is connected to one end of the signal output line that leads out from the field region of the magnetic resonance tomography apparatus at an RF output to evaluation electronics. A second diplexer can be connected between the one end of the signal output line and the signal output of the RF preamplifier, the second diplexer being connected with its low-frequency connection at the supply node, and having a broadband connection to the signal output line. A third diplexer corresponding to the second diplexer is connected with its broadband connection at the other end of the signal output line, and its radio-frequency connection leads to an RF output and the low-frequency output leads to the cross-over switch. The cross-over switch and thus the direct voltage source and the direct current source are located outside of the field region of the magnetic resonance tomography apparatus, and in the reception phase its supply voltage or supply current are transferred via the signal output line and the RF amplifier together with the amplified RF signal.

Thus no separate line is necessary for the feed of direct voltage or direct current to the RF preamplifier and the PIN diode, which further reduces the number of conductors proceeding out from the strong field region of the magnetic resonance tomography apparatus, with the advantages cited above. The second and third diplexers provide for a coupling in or coupling out of the direct components in the signal output line.

A low-pass filter can be connected between the supply nodes and the first diplexer.

A feedback loop is formed by the signal path from the signal output via the second diplexer, the supply node and its connection to the first diplexer and to the signal input. The low-pass filter serves to prevent unwanted RF feedback in this signal path at the RF preamplifier. The low-pass filter, however, allows the supply voltage or the supply current to pass unhindered to the PIN diode.

An arrangement for voltage increase and energy storage can be connected between the supply nodes and the first diplexer.

Such an arrangement is advantageous in the reception phase when the blocking voltage needed at the PIN diode is significantly higher than the supply voltage of the RF preamplifier. The supply voltage is increased to the necessary blocking voltage of the PIN diode by the arrangement, the energy needed for this being stored in the arrangement. The energy is fed to the arrangement during the transmission phase preceding each reception phase, in which transmission phase the PIN diode is fed with current. The voltage decrease which is caused by the current flowing through the storage arrangement is stored in a capacitor as electrical energy. The advantage of such an arrangement is that a voltage that is higher than is needed for the operation of the RF preamplifier does not have to be conducted in the arrangement, which would subsequently have to be transformed or divided down for the RF preamplifier, which would lead to additional power loss in the reception unit and the magnetic resonance tomography apparatus.

The arrangement for voltage increase and energy storage can be executed particularly simply and cost-effectively by a parallel connection of a Zener diode and a capacitor. During the transmission phase, the capacitor is charged via the current flowing through the PIN diode at the level of the Zener voltage. If the voltage necessary for the reception phase (thus the difference between the blocking voltage of the PIN diode and the operating voltage of the RF preamplifier) is reached at the capacitor, the additional flowing charge current is conducted through the Zener diode without further increasing the voltage at the capacitor. This voltage is thus the breakdown voltage of the Zener diode. The capacity of the capacitor only has to be large enough to be able to deliver the blocking current discharging through the PIN diode for a sufficient length of time during the reception phase without the capacitor voltage dropping below the minimum value of the necessary PIN diode blocking voltage.

An arrangement for energy storage can be connected between the supply node and the supply voltage connection. This ensures that the RF preamplifier is also supplied with operating voltage during the transmission phase. The operating temperature of the RF preamplifier, in particular its active semiconductor, thus remains stably constant so that no fluctuations of the amplification parameters etc. occur due to temperature drift. The feed line is nevertheless free for the current feed to the PIN diode.

The arrangement for energy storage can be executed particularly simply as a capacitor provided with a voltage regulator. The capacitor is sufficiently charged with energy via the connected supply voltage during the reception mode, and in fact to a voltage that slightly exceeds the operating voltage of the preamplifier. The voltage regulator or voltage stabilizer isolates the capacitor voltage from the operating voltage of the RF preamplifier. During the transmission phase, the storage capacitor discharges, and the operating voltage of the preamplifier furthermore remains constant via the voltage regulation. The storage capacity of the capacitor is designed so that the operating voltage at the RF preamplifier also remains constant during the longest-expected transmission mode duration.

If the diplexer used in the reception unit is a bias T network, circuit-dependent advantages result for the entire arrangement. A bias T network is composed of chokes and capacitors connected in a T-shape. The chokes and capacitors can thus fulfill a dual function in the feedback branch of the amplifier. Diplexers and low-pass filters thus can be realized by the same few components and thus can be made more simply and cost-effectively.

DESCRIPTION OF THE DRAWINGS

FIG. 4 shows an alternative embodiment of the circuit diagram according to FIG. 1 with an arrangement for energy storage for the RF preamplifier.

DESCRIPTION OF THE PREFERRED EMBODIMENTS

Figure 1:
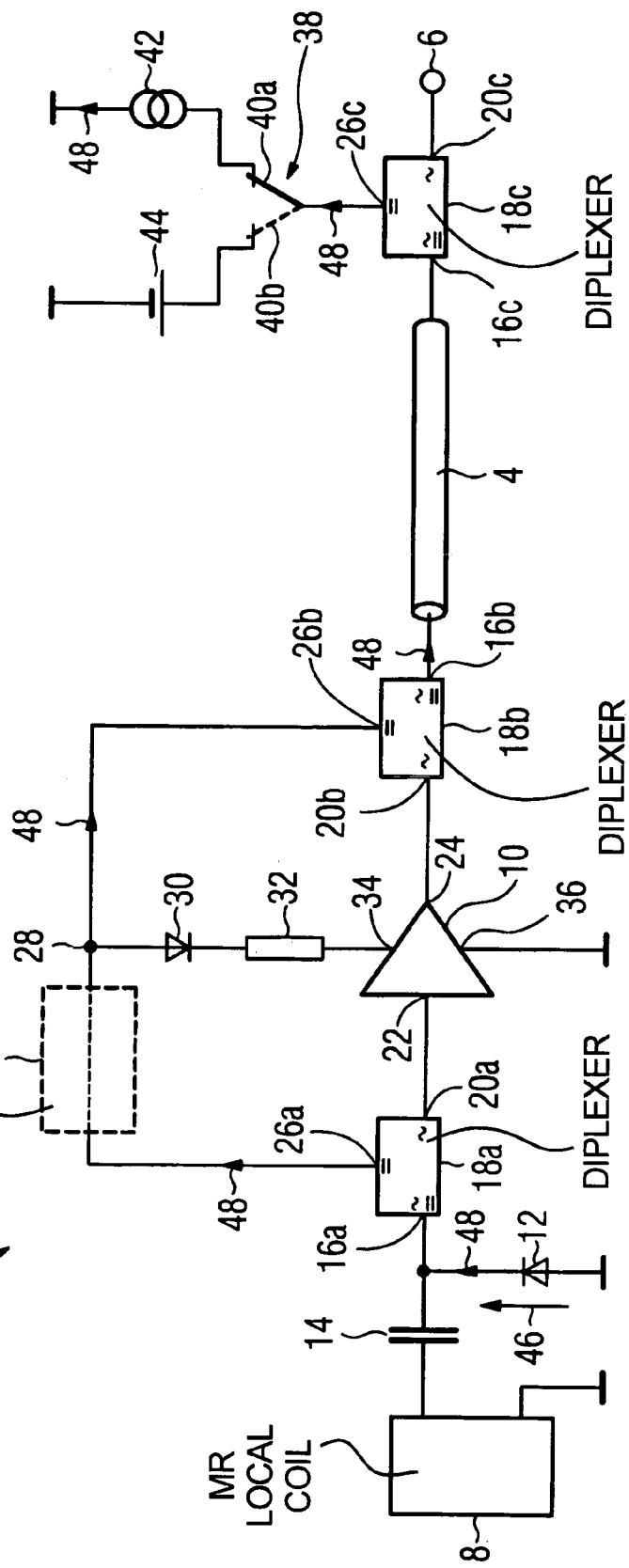
FIG. 1 is a circuit diagram of a reception unit of a magnetic resonance tomography apparatus in accordance with the invention, with communication supply for RF preamplifier and PIN diode.

FIG. 1 shows a reception unit 2 of a magnetic resonance tomography apparatus (not shown) whose active part is connected with an RF output 6 via a signal output line 4. The RF output 6 lies outside of the field range (strong field) of the magnetic resonance tomography apparatus, whereas the remainder of the reception unit 2 lies within this same field range. The signal output line 4 leading from the field region is therefore provided with sheath wave barriers (not shown).

The reception unit 2 includes a local coil 8 and an RF preamplifier 10. The local coil 8 is circuited in parallel with a PIN diode 12, with both components grounded on one side and connected at their opposite sides via a coupling capacitor 14 as a direct current block. The PIN diode 12 is grounded on its anode side. The connection of the coupling capacitor 14 facing away from the local coil 8 is directed to the broadband connection 16a of a diplexer 18a. The radio-frequency connection 20a of the diplexer 18a leads to the signal input 22 of the RF preamplifier 10.

The signal output 24 of the RF preamplifier 10 leads to the radio-frequency connection 20b of a second diplexer 18b, the broadband connection 16b of which in turn leads to the end of the signal output line 4 lying in the field region of the magnetic resonance tomography apparatus. The low-frequency connections 26a and 26b of the diplexers 18a and 18b are connected with a supply node 28. The supply node 28 is connected with the supply voltage connection 34 of the RF preamplifier 10 via a protective diode 30 and a pre-resistor 32. The RF preamplifier 10 is grounded at its ground connection 36.

The other end of the signal output line 4 lying outside of the field region leads to the broadband connection 16c of a third diplexer 18c, the radio-frequency connection 20c of which in turn leads to the RF output 6. The low-frequency connection 26c of the diplexer 18c leads to a cross-over switch 38 that connects the low-frequency connection 26c with a grounded current source 42 in the shown switch setting 40a. The cross-over switch 38 can be switched to a switch setting 40b so that the low-frequency connection 26c is connected with the voltage source 44.

The switch setting 40a is selected in a transmission phase of the magnetic resonance tomography apparatus. In such a transmission phase, extremely high RF field strengths are generated in the interior or strong field region of the magnetic resonance tomography apparatus in order to excite subjects to be examined on the atomic level. A measurement with the reception unit 2 does not occur during this transmission phase, which is why the local coil 8, the RF preamplifier 10 and the RF output 6 are not necessary and are not operated. Although the local coil 8 is designed to receive extremely small electromagnetic signals and is located at the reception site during the transmission phase, this also receives the transmission field that is stronger by many orders of magnitude. In order to short the amplifier input (thus the signal input 22) in terms of radio-frequency to protect it from destruction, the PIN diode 12 is fed in the flow-through direction 46 with a direct current 48 (generated by the direct current source 42), for example of 100 mA. The direct current 48 hereby selects the following path after passing the PIN diode 12: it flows through the diplexer 18a via the broadband and low-frequency connections 16a and 26a, passes the supply node 28, the diplexer 18b via the connections 26b and 16b, and the signal output line 4 and is conducted to the current source 42 via the connections 16c and 26c of the diplexer 18c via the switch setting 40a.

Since the current flow 48 is a direct current, it is kept away from the RF preamplifier 10 and RF output 6 by both the coupling capacitor 14 of the local coil 8 and by the radio-frequency connections 20a, b, c. Due to the conducting state voltage of the PIN diode 12, an electrical potential of approximately −0.7 V is present at the supply node 28, which is why the protective diode 30 blocks and thus the current flow 48 also keeps away from the supply voltage connection 34 of the RF preamplifier 10. The protective diode 30 thus acts as a polarity reversal protection for the RF preamplifier 10 that, in the example, is only designed for positive operating voltage. In most RF preamplifiers, a polarity-reversed operating voltage of only 0.7 V is not damaging. The protective diode can then be omitted.

The PIN diode 12 with current flowing through it acts in terms of RF as a short for the high currents and voltages detected (induced) by the local coil 8, such that these are kept away from the rest of the reception unit 2 and cannot cause damage. Feedbacks of the local coil 8 to the exciting field are likewise prevented since the resonance thereof is detuned.

If the transmission phase has ended, the magnetic resonance tomography apparatus switches into the reception phase. The strong excitation fields are deactivated and the subjects to be examined radiate weak electromagnetic signals due to the excitation in the transmission phase. These are detected by the reception unit 2 and conducted (amplified by the RF preamplifier 10) to the RF output 6 for further processing.

In the reception phase, the cross-over switch 38 is brought to the switch setting 40b. The direct voltage generated by the voltage source 44 is then present at the supply node 28 via the connections 26c and 16c of the diplexer 18c, the signal output line 4, the connections 16b and 26b of the diplexer 18b. The identical voltage is furthermore present at the PIN diode 12 as a blocking voltage via the connections 16a and 16a of the diplexer 16a. Due to the blocking voltage (of, for example, +30 V) present at the PIN diode 12, the PIN diode 12 is inactive in terms of RF so that it does not influence the very weak electrical signals acquired by the local coil 8 and transferred to the broadband connection 16a.

Due to the positive direct voltage present at the supply node 28, the RF preamplifier 10 is supplied with operating voltage. The protective diode 30 conducts and the pre-resistor 32 serves to adapt the node voltage at the supply node 28 to the required operating voltage (of, for example, 12 V) at the supply voltage connection 34 of the RF preamplifier 10. If the RF preamplifier 10 and the PIN diode 12 are designed so that the amplifier operating voltage and the diode blocking voltage are approximately equal, the voltage adaptation via the pre-resistor 32 can also be omitted.

The direct voltage of the direct voltage source 44 and the direct current 48 are kept away from local coil 8, RF preamplifier 10 and RF output 6 by the coupling capacitor 14 and the respective radio-frequency connections 20a, 20b, 20c of the diplexers 18a, 18b, 18c.

The radio-frequency measurement signals acquired by the local coil 8 pass the coupling capacitor 14, the connections 16a and 20a of the diplexer 18a in turn and arrive at the signal input 22 of the RF preamplifier 10. These same signals (amplified at the signal output 24) furthermore arrive at the RF output 6 where they are available for further processing, via the connections 20b and 20c, 16b and 16c of the diplexers 18b and 18c and the signal output line 4. The radio-frequency signals are kept away from both the voltage source 44 and the supply node 28 by the low-frequency connections 26a, 26b, 26c of the corresponding diplexers 18a, 18b and 18c. No feedback from the signal output 24 to the signal input 22 thus occurs, in particular over the signal path containing the supply node 28.

Should the radio-frequency damping provided by the diplexers 18a and 18b not be sufficient in order to suppress a feedback just mentioned, a low-pass filter 50 can optionally also be connected between supply node 28 and low-frequency connection 26a of the diplexer 18a, as shown dashed in FIG. 1.

Figure 2A:
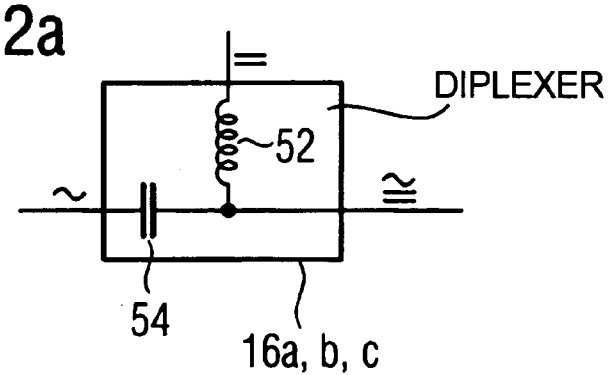
FIG. 2 is a circuit realization for a diplexer and a low-pass filter from FIG. 1.
Figure 2B:
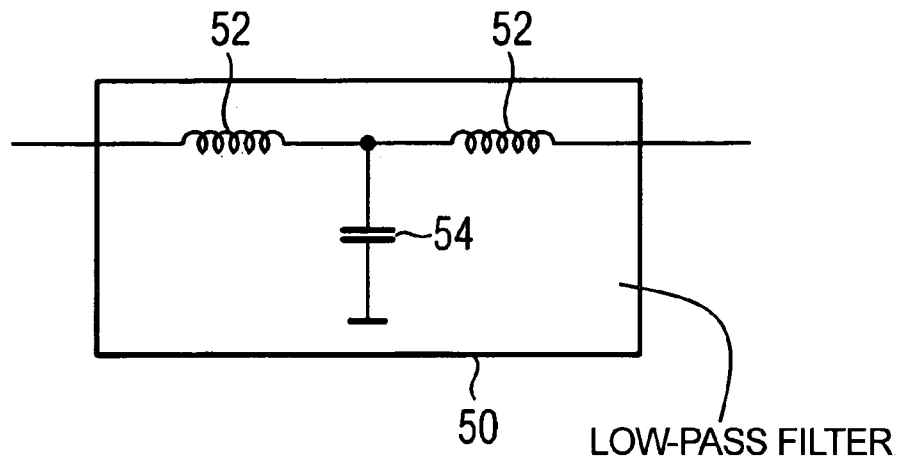

FIGS. 2a and 2b show respective embodiments for the diplexer 18a (also applicable for diplexers 18b and 18c) and the low-pass filter 50, respectively composed of a choke 52 and a blocking capacitor 54. In the design of the circuit according to FIG. 1, for example, by appropriate selection of the component dimensions and placement, the choke 52 or blocking capacitor 54 can fulfill a dual function in the sense of a low-pass filter 50 and a diplexer 18a. The component expenditure is thereby reduced.

Figure 3:
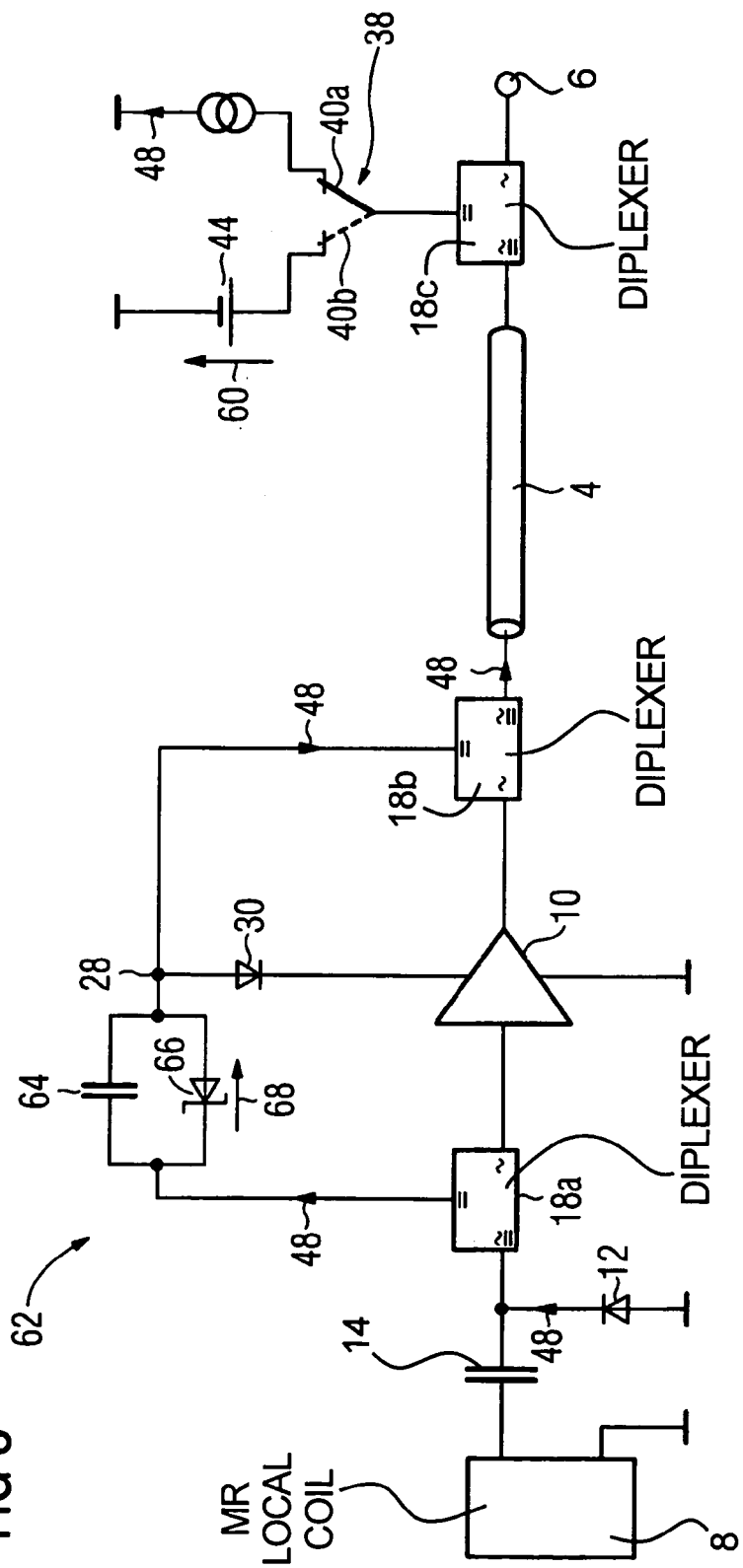
FIG. 3 shows an alternative embodiment of the circuit diagram of FIG. 1, with an arrangement for energy storage and voltage increase for the PIN diode.

FIG. 3 shows an alternative embodiment of FIG. 1 in which the voltage 60 generated by the voltage source 44 corresponds to the supply voltage of the RF preamplifier 10. A pre-resistor 32 connected in series with the protective diode 30 is therefore not necessary, thus in the reception phase no voltage decreases and thus no power loss is produced. Moreover, compared to FIG. 1, only a lower voltage 60 of, for example, 12 V (instead of 30 V) must be transferred to the RF preamplifier 10 via the signal output line 4. However, in the shown example the voltage of 12 V now present at the supply node 28 as a blocking voltage is not sufficient for the PIN diode 12. An arrangement 62, namely the parallel connection of a storage capacitor 64 and a Zener diode 66, is therefore connected between the supply node 28 and the diplexer 18a.

During the transmission phase that always precedes each reception phase, the transmission phase corresponding to the switch setting 40a, as in FIG. 1 the current flow 48 flows through the storage capacitor 64 and develops a voltage at this until the breakdown voltage 68 of the Zener diode is achieved, whereupon the current flow 48 subsequently proceeds via the Zener diode 66. During the subsequent reception phase, the voltage at the capacitor 64 (corresponding to the breakdown voltage 68) adds to the supply voltage as a blocking voltage at the PIN diode 12, so the breakdown voltage 68 remains nearly constant since the discharge current of the storage capacitor 64 is merely the blocking voltage flowing through the PIN diode 12.

FIG. 4 shows a further embodiment of the arrangement from FIG. 1, in which the pre-resistor 32 is replaced by an arrangement 70 for energy storage. The arrangement 70 is supplied with energy and charged in the reception phase (corresponding to the switch setting 40a) when the voltage 60 is present at the supply node 28. In a subsequently transmission phase (corresponding to switch setting 40b), the voltage at the supply node 28 drops to a negative value (as explained in connection with FIG. 1) and thus is no longer available as a supply voltage for the RF preamplifier 10. The protective diode 30 thus is in a blocking state. However, the RF preamplifier is still supplied with energy from the arrangement 70 during the entire transmission phase. The power loss in the RF preamplifier 10 thus remains constant and thus the temperature of its active semiconductors remains constant as well, which is why temperature drift problems in the RF preamplifier at the change-over points in time between transmission and reception phases are hereby prevented.

Figure 5:
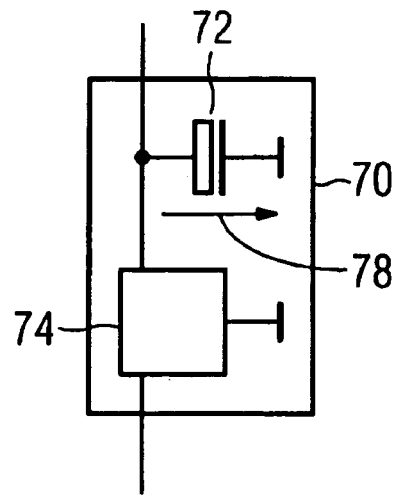
FIG. 5 is a circuit realization of the arrangement for energy storage of FIG. 4.

FIG. 5 shows an embodiment of the arrangement 70 as a parallel circuit of a grounded storage capacitor 72 with a grounded voltage regulator 74. The capacity of the storage capacitor 72 is to be determined so that, even during the longest-possible transmission phase, the operating current 76 of the RF preamplifier 10 can be removed without the operating voltage of the RF preamplifier dropping. The voltage regulator 74 keeps the voltage present at the supply voltage connection 34 of the RF preamplifier 10 constant. The voltage 60 generated by the voltage source 44 is (as in FIG. 1) the blocking voltage of the PIN diode 12 and (due to the voltage drop in the voltage regulator) is slightly higher than the supply voltage of the RF preamplifier 10.

Although modifications and changes may be suggested by those skilled in the art, it is the intention of the inventor to embody within the patent warranted hereon all changes and modifications as reasonably and properly come within the scope of his contribution to the art.

I claim as my invention:

1. A reception unit for a magnetic resonance tomography apparatus having a local reception coil, said reception unit comprising:
    an RF preamplifier having a signal input adapted for connection to the local coil, said RF preamplifier having a supply voltage input;
    a PIN diode connected in parallel with said signal input;
    a direct voltage source;
    a direct current source;
    a switch having a first switch terminal selectively connectable to said direct voltage source during a reception phase of said local coil and to said direct current source during a transmission phase of said local coil, said switch having a second switch terminal; and a supply note connecting said supply voltage input of said RF preamplifier, said PIN diode, and said second switch terminal, so that said supply node also is connected to said direct voltage source during said reception phase and to said direct current source during said transmission phase.

2. A reception unit as claimed in claim 1 comprising a diplexer connected between said supply node, said signal input of said RF preamplifier and said PIN diode, and a direct current block connected between said PIN diode and said local coil.

3. A reception unit as claimed in claim 2 wherein said diplexer is a bias T network.

4. A reception unit as claimed in claim 2 having an RF output, and wherein said diplexer is a first diplexer and wherein said RF preamplifier has a signal output, said reception unit comprising a signal output line having a first end and second end, a second diplexer connected between said signal output of the RF preamplifier, said first end of said signal output line and said supply node, and a third diplexer connected between said second end of said signal output line, said second switch terminal, and said RF output.

5. A reception unit as claimed in claim 4 comprising a low-pass filter connected between said supply node and said first diplexer.

6. A reception unit as claimed in claim 4 wherein said first diplexer, said second diplexer and said third diplexer are each formed by a bias T network.

7. A reception unit as claimed in claim 2 comprising an arrangement for voltage increase and energy storage, connected between said supply node and said diplexer.

8. A reception unit as claimed in claim 7 wherein said arrangement for voltage increase and energy storage comprises a Zener diode and a capacitor connected in parallel with said Zener diode.

9. A reception unit as claimed in claim 1 comprising an arrangement for energy storage connected between said supply node and said supply voltage input of said RF preamplifier.

10. A reception unit as claimed in claim 9 wherein said arrangement for energy storage comprises a capacitor and a voltage regulator for said capacitor.

11. A reception unit as claimed in claim 1 comprising a protective diode connected between said supply node and said supply voltage input of said RF preamplifier.

* * * * *